United States Patent
Tanaka et al.

(10) Patent No.: US 10,205,113 B2
(45) Date of Patent: Feb. 12, 2019

(54) ORGANIC ELECTROLUMINESCENCE DEVICE INCLUDING AN EMISSIVE LAYER INCLUDING AN ASSISTANT DOPANT LAYER AND LIGHT-EMITTING DOPANT LAYER

(71) Applicant: Japan Display Inc., Minato-ku (JP)

(72) Inventors: Masaki Tanaka, Minato-ku (JP); Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/343,625

(22) Filed: Nov. 4, 2016

(65) Prior Publication Data
US 2017/0141340 A1    May 18, 2017

(30) Foreign Application Priority Data
Nov. 13, 2015 (JP) ................. 2015-222820

(51) Int. Cl.
*H01L 27/32* (2006.01)
*H01L 51/50* (2006.01)
(Continued)

(52) U.S. Cl.
CPC ...... *H01L 51/5028* (2013.01); *H01L 27/3211* (2013.01); *H01L 27/3262* (2013.01); *H01L 51/5016* (2013.01); *H01L 51/5203* (2013.01); *G09G 3/3233* (2013.01); *G09G 2300/0426* (2013.01); *G09G 2300/0809* (2013.01); *G09G 2310/0278* (2013.01); *H01L 51/005* (2013.01);
(Continued)

(58) Field of Classification Search
CPC .......... H01L 51/50; H01L 27/32; H01L 51/52

USPC .................................. 257/101–103; 313/504
See application file for complete search history.

(56) References Cited

U.S. PATENT DOCUMENTS

| | | | | |
|---|---|---|---|---|
| 2006/0102925 A1* | 5/2006 | Liu | ...................... | H01L 33/0079 257/103 |
| 2011/0233575 A1* | 9/2011 | Huang | .................. | H01L 27/153 257/89 |

(Continued)

FOREIGN PATENT DOCUMENTS

JP    2014-22666    2/2014

OTHER PUBLICATIONS

Hajime Nakanotani, et al. "High-efficiency organic light-emitting diodes with fluorescent emitters", Nature Communications, 5:4016, 2014, 7 pages.

*Primary Examiner* — Sheng Zhu
(74) *Attorney, Agent, or Firm* — Oblon, McClelland, Maier & Neustadt, L.L.P.

(57) ABSTRACT

In an organic EL device, the light emission efficiency by a TADF mechanism is to be improved with an emissive layer structure that can be easily formed. An OLED has at least an emissive layer between an upper electrode and a lower electrode. The emissive layer includes: a host layer including a host material; an assistant dopant layer which is a layer adjacent to the host layer and where an assistant dopant made of a thermally activated delayed fluorescence material and the host material are intermingled within a plane; and a light-emitting dopant layer which is a layer adjacent to the assistant dopant layer and where a light-emitting dopant made of a fluorescent material emitting light by being excited by the assistant dopant and the host material are intermingled within a plane.

4 Claims, 10 Drawing Sheets

(51) Int. Cl.
*H01L 51/52* (2006.01)
*H01L 51/00* (2006.01)
*G09G 3/3233* (2016.01)

(52) U.S. Cl.
CPC ........ *H01L 51/006* (2013.01); *H01L 51/0052* (2013.01); *H01L 51/0055* (2013.01); *H01L 51/0056* (2013.01); *H01L 51/0067* (2013.01); *H01L 51/0071* (2013.01); *H01L 51/0072* (2013.01); *H01L 51/0073* (2013.01)

(56) References Cited

U.S. PATENT DOCUMENTS

| | | | |
|---|---|---|---|
| 2012/0248968 A1* | 10/2012 | Ogiwara | H01L 51/5012 313/504 |
| 2014/0034930 A1* | 2/2014 | Seo | H01L 51/5016 257/40 |
| 2014/0124753 A1* | 5/2014 | Lee | H01L 51/5012 257/40 |
| 2015/0188070 A1 | 7/2015 | Ogiwara et al. | |
| 2016/0064677 A1 | 3/2016 | Ogiwara et al. | |

* cited by examiner

ORGANIC ELECTROLUMINESCENCE DEVICE INCLUDING AN EMISSIVE LAYER INCLUDING AN ASSISTANT DOPANT LAYER AND LIGHT-EMITTING DOPANT LAYER

CROSS-REFERENCE TO RELATED APPLICATION

The present application claims priority from Japanese application JP2015-222820 filed on Nov. 13, 2015, the content of which is hereby incorporated by reference into this application.

BACKGROUND OF THE INVENTION

1. Field of the Invention

The present invention relates to an organic electroluminescence (EL) device and particularly to an improvement in light emission efficiency using a thermally activated delayed fluorescence (TADF) material.

2. Description of the Related Art

An organic EL device is generally referred to as OLED (organic light-emitting diode), which is a kind of light-emitting diode. In the emissive layer of the organic EL device, a light-emitting dopant is excited by the recombination of holes injected from the anode and electrons injected from the cathode, and a singlet excited state and a triplet excited state are generated at a ratio of 1:3. In the organic EL device using a fluorescent material as the light-emitting dopant, only the singlet excited state contributes to light emission and light is not emitted when the triplet excited state is deactivated. Therefore, the limit of its internal quantum efficiency is considered to be 25%. Research has been done utilizing a TADF mechanism as an organic EL light emission mechanism to solve this problem. This TADF mechanism utilizes the phenomenon of reverse intersystem crossing (RISC) from a triplet excited state with lower energy to a singlet exciton with higher energy, generated by thermal activation in a material with a small difference in energy between the singlet excited state and the triplet excited state. According to this, theoretically, the internal quantum efficiency of fluorescent emission can be increased to 100%.

Recently, a TADF material which enables light emission in all of red (R), green (G), and blue (B) at room temperature has been developed. FIG. 10 is a schematic view for explaining a fluorescent emission mechanism in an organic EL device using a TADF material as an assistant dopant (see H. Nakanotani, et al., "High efficiency organic light-emitting diodes with fluorescent emitters," Nature Commun. 5, 4016 (2014)). To the emissive layer of this organic EL device, the TADF material is added as well as a host material and a light-emitting dopant material. In FIG. 10, the energy level of each material is shown. So indicates the ground state. $S_1$ indicates the lowest singlet excited state. $T_1$ indicates the lowest triplet excited state. In the illustration, the higher the position is, the higher the energy level is. The light-emitting dopants TBPe, TTPA, TBRb, and DBP emit blue, green, orange, and red fluorescent lights, respectively. The shorter the light emission wavelength of the material is, the higher the $S_1$ energy level is. 25% of the recombination of holes ($h^+$) and electrons ($e^-$) results in the $S_1$ level of TADF molecules of the assistant dopant, and 75% results in the $T_1$ level. Here, the TADF molecules of the $T_1$ level are upconverted to the $S_1$ level by the RISC process with thermal energy. Using the TADF molecules having a higher $S_1$ level than the light-emitting dopant, as the assistant dopant, energy transfer of the singlet exciton of the TADF molecules to the light-emitting dopant of each color can be performed by fluorescence resonance energy transfer (FRET), and fluorescent emission of each color can thus be achieved.

SUMMARY OF THE INVENTION

The improvement in the light emission efficiency in the mechanism shown in FIG. 10 requires efficient transfer of the excitation energy generated by the recombination of holes and electrons to the assistant dopant and efficient transfer of the excitation energy from the assistant dopant to the light-emitting dopant.

In this respect, as the distance between the host molecules and the assistant dopant molecules and the distance between the assistant dopant molecules and the light-emitting dopant molecules increase, the probability of energy transfer drops and therefore improvement in the light emission efficiency becomes difficult.

The invention is to provide an organic EL device having an emissive layer of a structure which can be formed relatively easily and in which respective materials can be brought closer to each other, thus allowing for the expectation of improved light emission efficiency.

According to an aspect of the invention, an organic EL device having at least an emissive layer between a pair of electrodes made up of an anode and a cathode. The emissive layer includes: a host layer made of a host material; an assistant dopant layer which is adjacent to the host layer and where an assistant dopant made of a thermally activated delayed fluorescence material and the host material are intermingled within a plane; and a light-emitting dopant layer which is adjacent to the assistant dopant layer and where a light-emitting dopant made of a fluorescent material emitting light by being excited by the assistant dopant and the host material are intermingled within a plane.

DETAILED DESCRIPTION OF THE INVENTION

Hereinafter, a form of embodying the invention (hereinafter referred to as an embodiment) will be described with reference to the drawings.

The disclosure is only an example, and as a matter of course, any change that can be easily thought of by a person skilled in the art without departing from the spirit of the invention should be included in the scope of the invention. In order to clarify the explanation, the drawings may schematically show each part in terms of its width, thickness, shape and the like, compared with the actual configuration. However, this is simply an example and should not limit the interpretation of the invention. Also, elements similar to those described before with reference to already mentioned drawings may be denoted by the same reference signs, and detailed description of these elements may be omitted when appropriate.

The embodiment below is an organic EL display device, which displays an image using an organic EL device according to the invention. The organic EL display device is an active-matrix display device and is installed in a television, personal computer, mobile terminal, mobile phone and the like.

In an image display area of the display device, a plurality of pixels forming an image is arranged two-dimensionally. Here, the direction along one coordinate axis of a two-dimensional orthogonal coordinate system corresponding to the image is defined as a row direction, and the direction along the other coordinate axis is defined as a column direction. In the description below, the row direction and the column direction are basically the horizontal direction and the vertical direction of the image. However, this definition is made as a matter of convenience. For example, in a display device which can display an image, switching the vertical and horizontal sides of the image in the same image display area, the row direction and the column direction of the image display area can be the vertical direction and the horizontal direction of the image, respectively. Also, the structure of the display device can be configured in such a way that the row direction and the column direction are switched with respect to what is described below.

Also, in the embodiment below, a display device which can display a color image by having a plurality of types of pixels (subpixels) with different light-emitting colors from each other arranged in an image display area will be described. The pixels in a color image correspond to a set of subpixels made up of a plurality of types of subpixels in the display device. However, in the display device, the subpixel is the structural unit, and an OLED and a pixel circuit are formed for each subpixel. Thus, in the description below, a subpixel is basically regarded as a pixel.

First Embodiment

Figure 1:
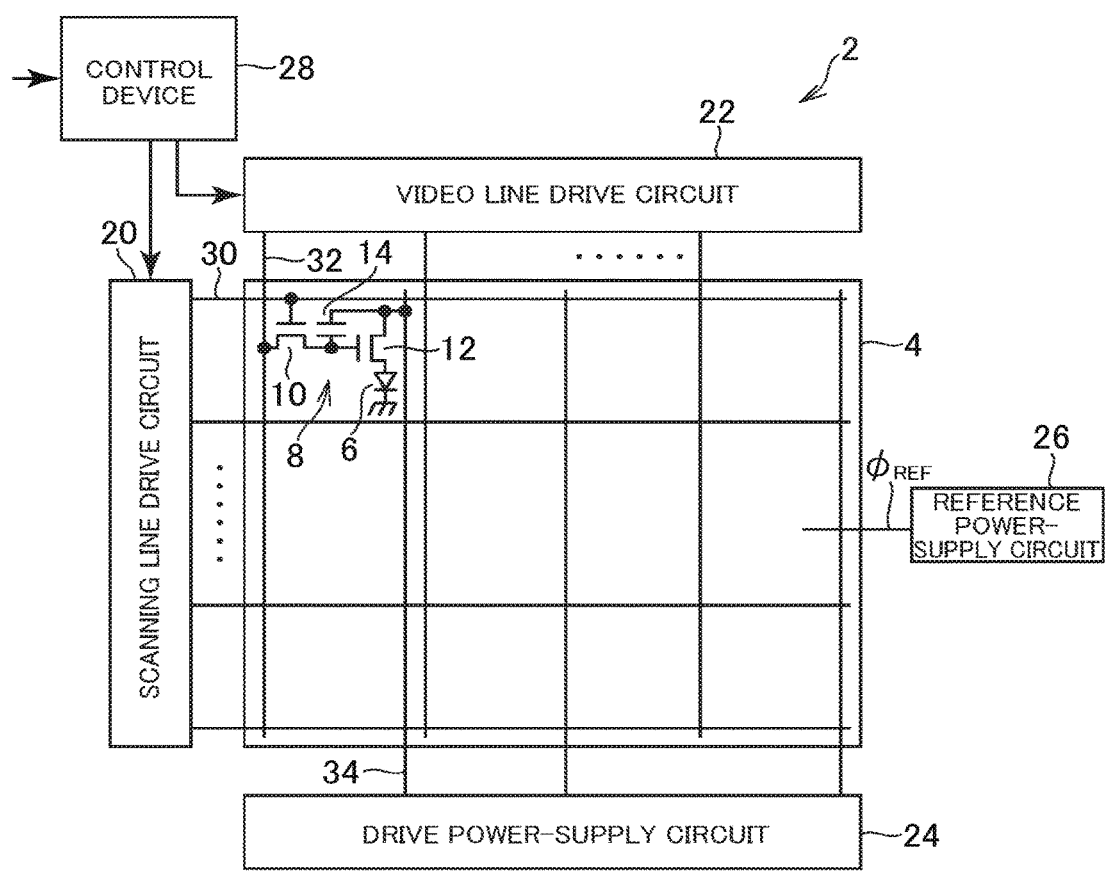
FIG. 1 is a schematic view showing a schematic configuration of an organic EL display device according to an embodiment of the invention.

FIG. 1 is a schematic view showing a schematic configuration of an organic EL display device 2 according to the embodiment. The organic EL display device 2 has a pixel array unit 4 which displays an image, and a drive unit which drives the pixel array unit. In the organic EL display device 2, a multilayer structure including a thin film transistor (TFT), OLED and the like is formed on a substrate made of glass or flexible resin film.

In the pixel array unit 4, an OLED 6 and a pixel circuit 8 are arranged in the form of a matrix corresponding pixels. The pixel circuit 8 is made up of a plurality of TFTs 10, 12 and a capacitor 14.

Meanwhile, the drive unit includes a scanning line drive circuit 20, a video line drive circuit 22, a drive power-supply circuit 24, a reference power-supply circuit 26, and a control device 28. The drive unit has functions such as driving the pixel circuit 8 to control the light emission of the OLED 6.

The scanning line drive circuit 20 is connected to a scanning signal line 30 provided for each horizontal line of pixels (pixel row). The scanning line drive circuit 20 sequentially selects a scanning signal line 30 in response to a timing signal inputted from the control device 28, and applies a voltage to switch on the lighting TFT 10, to the selected scanning signal line 30.

The video line drive circuit 22 is connected to a video signal line 32 provided for each vertical line of pixels (pixel column). The video line drive circuit 22 has a video signal inputted from the control device 28, and outputs a voltage corresponding to the video signal for the selected pixel row to each video signal line 32, simultaneously with the selection of the scanning signal line 30 by the scanning line drive circuit 20. This voltage is written in the capacitor 14 via the lighting TFT 10, in the selected pixel row. The drive TFT 12 supplies a current corresponding to the written voltage to the OLED 6, and this causes the OLED 6 of the pixel corresponding to the selected scanning signal line 30 to emit light.

The drive power-supply circuit 24 is connected to a drive power-supply line 34 provided for each pixel column, and supplies a current to the OLED 6 via the drive power-supply line 34 and the drive TFT 12 in the selected pixel row.

The reference power-supply circuit 26 provides a constant potential $\phi_{REF}$ to a common electrode (not illustrated) forming the cathode electrode of the OLED 6. $\phi_{REF}$ can be set to ground potential GND (0 V), for example.

In this embodiment, the lower electrode of the OLED 6 is a pixel electrode formed for each pixel, and the upper electrode of the OLED 6 is a counter electrode arranged opposite the pixel electrode. The lower electrode is connected to the drive TFT 12. Meanwhile, the upper electrode is formed by an electrode common to the OLEDs 6 of all the pixels. In this embodiment, the lower electrode is the anode of the OLED 6, and the upper electrode is the cathode.

Figure 2:
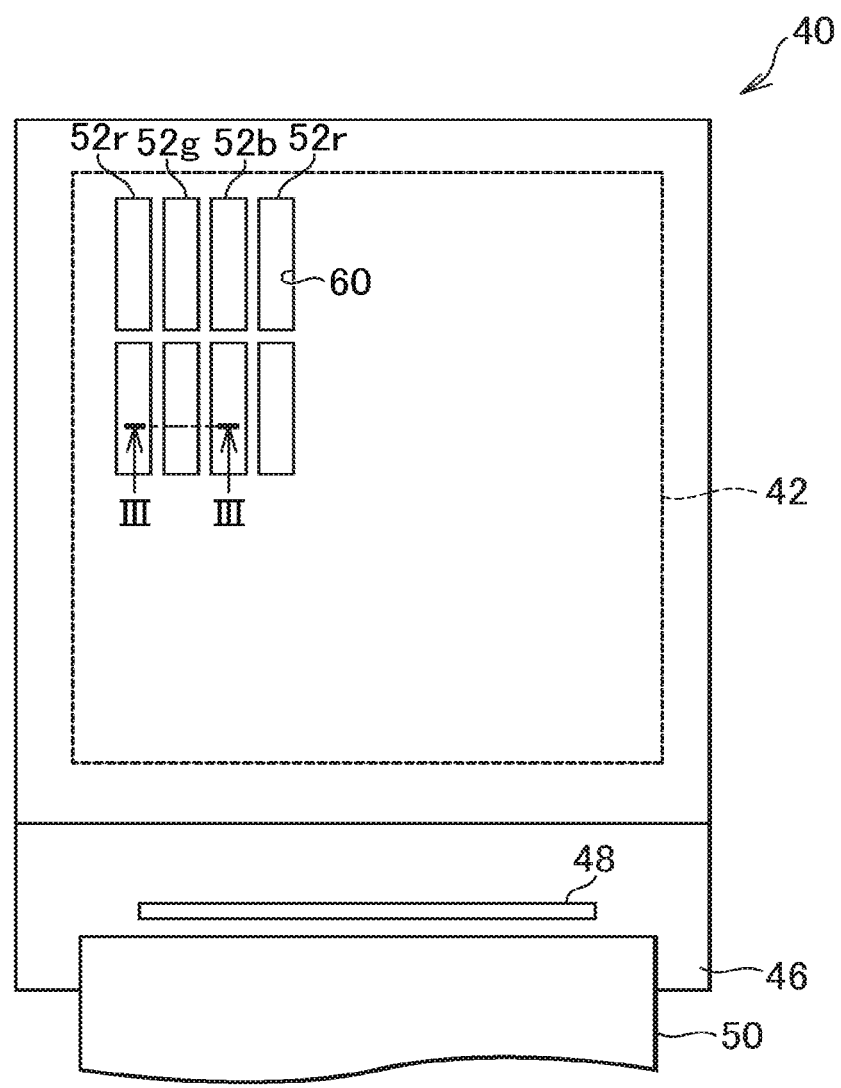
FIG. 2 is a schematic plan view of a display panel of the organic EL display device according to the embodiment of the invention.

FIG. 2 is a schematic plan view of a display panel 40 of the organic EL display device 2. The pixel array unit 4 shown in FIG. 1 is provided in a display area 42 of the display panel 40, and the OLEDs are arrayed in the pixel array unit 4 as described above. A component mounting area 46 is provided on one side of the rectangular display panel 40, and a wiring connected to the display area 42 is arranged in the component mounting area 46. Moreover, in the component mounting area 46, a driver IC 48 forming the drive unit is installed and an FPC 50 is connected. The FPC 50 is connected to the control device 28 and the other circuits 20, 22, 24, 26 and the like, and has an IC installed thereon.

The display panel 40 in this embodiment displays a color image. The pixels in the color image are made up of pixels (subpixels) which emit light corresponding to red (R), green (G), and blue (B), for example.

In this embodiment, an example in which an R pixel 52*r*, a G pixel 52*g*, and a B pixel 52*b* are arranged in stripes in the display area is described. In this arrangement, pixels of the same type (color) are arrayed in the vertical direction of the image, and RGB are arrayed cyclically in the horizontal direction. In FIG. 2, each of the R pixel 52*r*, the G pixel 52*g*, and the B pixel 52*b* schematically shows an effective light-emitting area. In terms of structure, these pixels correspond to pixel apertures 60, and the areas between these pixels correspond to banks 106.

The display panel 40 has a structure in which a TFT substrate and a counter substrate are bonded together with filler held between these substrates, for example. A circuit formed by a TFT 72 or the like, and the OLED 6 or the like are formed on the TFT substrate. A polarizer and a touch panel can be provided on the counter substrate.

Figure 3:
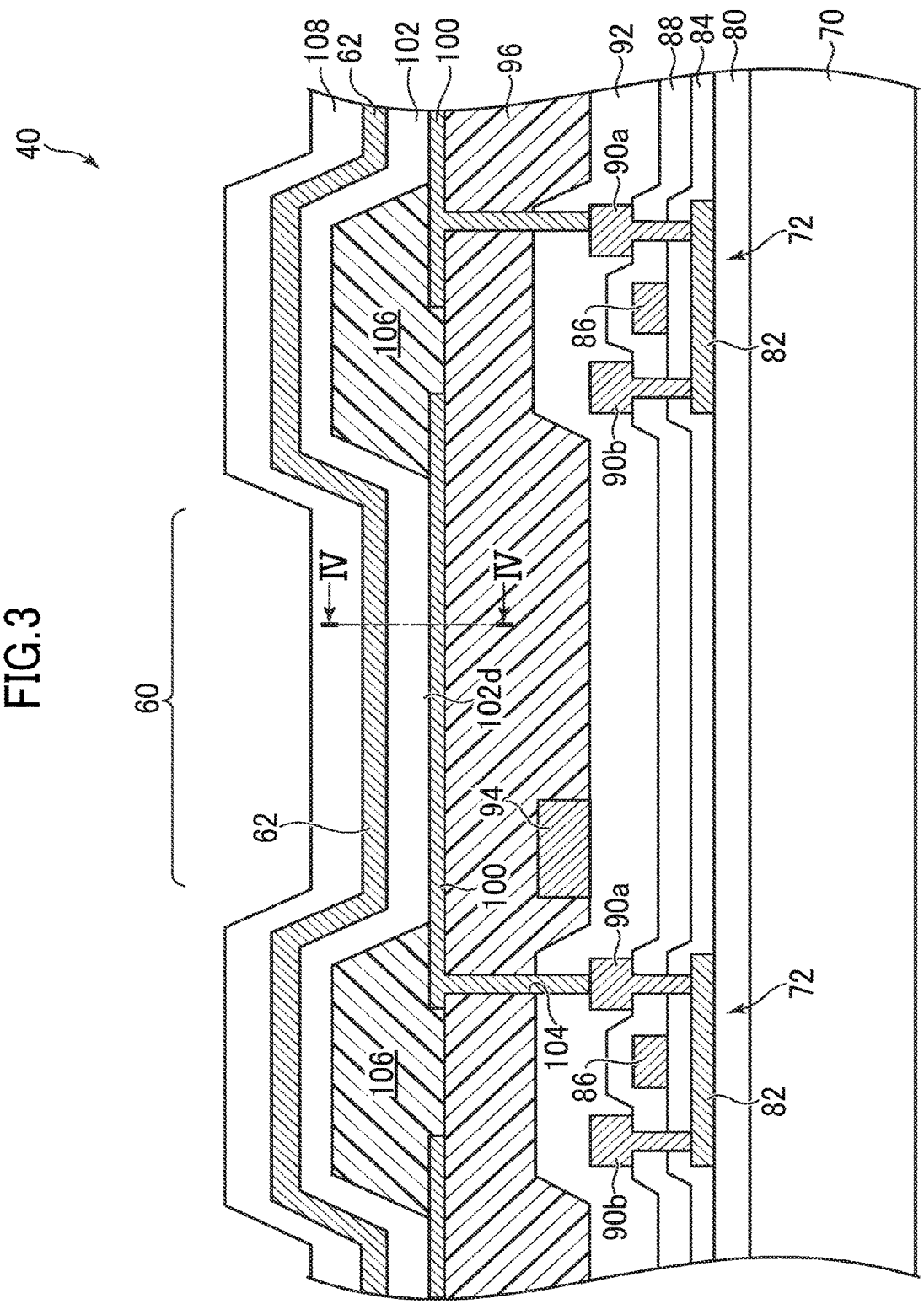
FIG. 3 is a schematic vertical cross-sectional view of the display panel, taken along shown in FIG. 2.

FIG. 3 is schematic vertical cross-sectional view of the display panel 40, taken along shown in FIG. 2. FIG. 3 shows the cross-sectional structure of the TFT substrate but does not show the structure of the filler layer and the counter substrate formed thereon. In this embodiment, the pixel array unit 4 is a top emission type, and the light generated by the OLED 6 formed on the TFT substrate is emitted from the counter substrate. That is, in FIG. 3, the light of the OLED 6 is emitted upward.

The structure of the TFT substrate is formed by stacking and patterning various layers on a substrate 70 made of glass or resin film.

Specifically, a polysilicon (p-Si) film is formed via an underlying layer 80 made of an inorganic insulating material such as silicon nitride ($SiN_y$) or silicon oxide ($SiO_x$) on the substrate 70, and this p-Si film is patterned and selectively left at a part used for a circuit layer. For example, a semiconductor area 82 that forms a channel part and source and drain parts of a top gate-type TFT 72 is formed using the p-Si film. On the channel part of the TFT 72, a gate electrode 86 is arranged via a gate insulating film 84. The gate electrode 86 is formed by patterning a metal film formed by sputtering or the like. Subsequently, an interlayer insulating film 88 covering the gate electrode 86 is stacked. An impurity is introduced by ion injection into the p-Si that forms the source part and the drain part of the TFT 72, and a source electrode 90*a* and a drain electrode 90*b* that are electrically connected to these parts are formed. After the TFT 72 is thus formed, an interlayer insulating film 92 is stacked. On the surface of the interlayer insulating film 92, a wiring 94 or the like formed by patterning a metal film formed by sputtering can be formed. This metal film, and the metal film used to form the gate electrode 86, the source electrode 90*a* and the drain electrode 90*b* can form, for example, the scanning signal line 30, the video signal line 32, and the drive power-supply line 34 shown in FIG. 1, as a multilayer wiring structure. For example, an organic material such as an acrylic resin is stacked thereon to forma flattening film 96, and the OLED 6 is formed on the surface of the display area 42 thus flattened. A sealing film 108 is formed on the OLED 6. The sealing film 108 has the function of preventing moisture or the like from passing through and thus protecting the OLED 6.

The OLED 6 is made up of a lower electrode 100, a light-emitting element layer 102, and an upper electrode 62. The lower electrode 100, the light-emitting element layer 102, and the upper electrode 62 are stacked in order from the side of the substrate 70.

If the TFT 72 shown in FIG. 3 is the drive TFT 12 having an n-channel, the lower electrode 100 is connected to the source electrode 90*a* of the TFT 72. Specifically, after the flattening film 96 is formed, a contact hole 104 for connecting the lower electrode 100 to the TFT 72 is formed, and a conductive film formed on the surface of the flattening film 96 and inside the contact hole 104 is patterned, thus forming the lower electrode 100 connected to the TFT 72 separately for each pixel.

For example, the lower electrode 100 is formed of ITO, IZO or the like. Also, since this embodiment is a top emission type, the lower electrode 100 can be formed as a structure in which a transparent conductive film is stacked on a reflection layer formed of a material with high light reflectance. For example, the reflection layer can be formed of aluminum (Al), silver (Ag) or the like, thus reflecting the light from the emissive layer toward the display surface, that is, toward the upper electrode 62.

As described above, the drive TFT 12 controls the current flowing to the OLED 6 in accordance with the video signal of each pixel, and the lower electrode 100 supplies carriers in an amount corresponding to the video signal of each pixel, to the light-emitting element layer 102. Specifically, in this embodiment, the lower electrode 100 is the anode, and holes as carriers are supplied from the lower electrode 100 to the light-emitting element layer 102.

Figure 4:
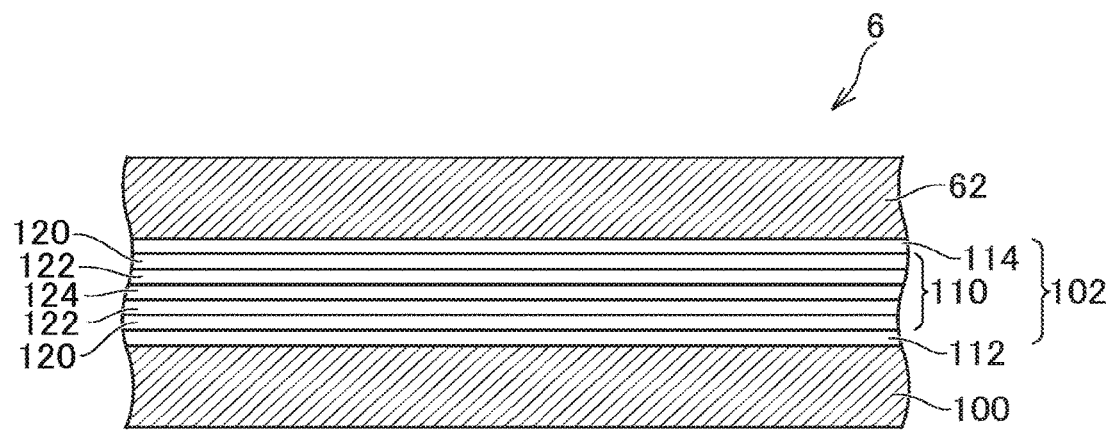
FIG. 4 is a vertical cross-sectional view of the display panel, taken along IV-IV shown in FIG. 3, and a schematic view showing the structure of an OLED according the first embodiment of the invention.

FIG. 4 is a schematic view showing the structure of the OLED 6 in the display panel 40, and shows a vertical cross section taken along IV-IV in FIG. 3.

The light-emitting element layer 102 has an emissive layer (EML) 110 made of an organic compound and emits light as carriers (electrons and holes) are injected into the emissive layer 110. The light-emitting element layer 102 also has an auxiliary layer for efficiently injecting carriers into the emissive layer 110 when applying a voltage to the OLED 6. Specifically, a hole transport layer (HTL) and a hole injection layer (HIL) are provided between the anode and the emissive layer. An electron transport layer (ETL) and an electron injection layer (EIL) are provided between the cathode and the emissive layer. For example, in FIG. 4, an HTL/HIL layer 112 provided between the lower electrode 100 as the anode and the emissive layer 110 is made up of an HIL layer provided toward the lower electrode 100 and an HTL layer provided toward the emissive layer 110. An ETL/EIL layer 114 between the upper electrode 62 as the cathode and the emissive layer 110 is made up of an EIL layer provided toward the upper electrode 62 and an ETL layer provided toward the emissive layer 110.

The emissive layer 110 includes a host layer 120, an assistant dopant layer 122, and a light-emitting dopant layer 124. The host layer 120 is formed of a host material. The host material is an organic substance responsible for transporting carriers. For example, the host material is mCBP (3,3'-di(9H-carbazol-9-yl) biphenyl), mCP (1,3-bis(carbazol-9-yl)benzene), DPEPO (Bis(2-[(oxo)diphenylphosphino]phenyl)ether) described in the reference literature, or the like.

The assistant dopant layer 122 is formed of an assistant dopant and the host material. An area made up of the assistant dopant and an area made up of the host material are intermingled within the plane of this layer. The assistant dopant is made of a TADF material. For example, the assistant dopant is ACRSA (10-phenyl-10H,10'H-spiro[acridine-9,9'-anthracen]-10'-one), ACRXTN (3-(9,9-dimethylacridin-10(9H)-yl)-9H-xanthen-9-one), PXZ-TRZ (2-phenoxazine-4,6-diphenyl-1,3,5-triazine), tri-PXZ-TRZ (2,4,6-tri(4-(10H-phenoxazin-10H-yl)phenyl)-1,3,5-triazine) described in the reference literature, or the like.

The light-emitting dopant layer 124 is formed of a light-emitting dopant and the host material. An area made up of the light-emitting dopant and an area made up of the host material are intermingled within the plane of this layer. The light-emitting dopant layer 124 can also include the assistant dopant. In this case, an area made up of the assistant dopant and the areas of the other two materials are intermingled within the plane of the light-emitting dopant layer 124. For example, the light-emitting dopant is as described in the reference literature. Specifically, TBPe (2,5,8,11-tetra-tert-butylperylene) for blue light emission, TTPA (9,10-bis[N, N-di-(p-tolyl)-amino] anthracene for green light emission, and DBP (tetraphenyldibenzoperiflanthene) for red light emission can be used.

Figure 10:
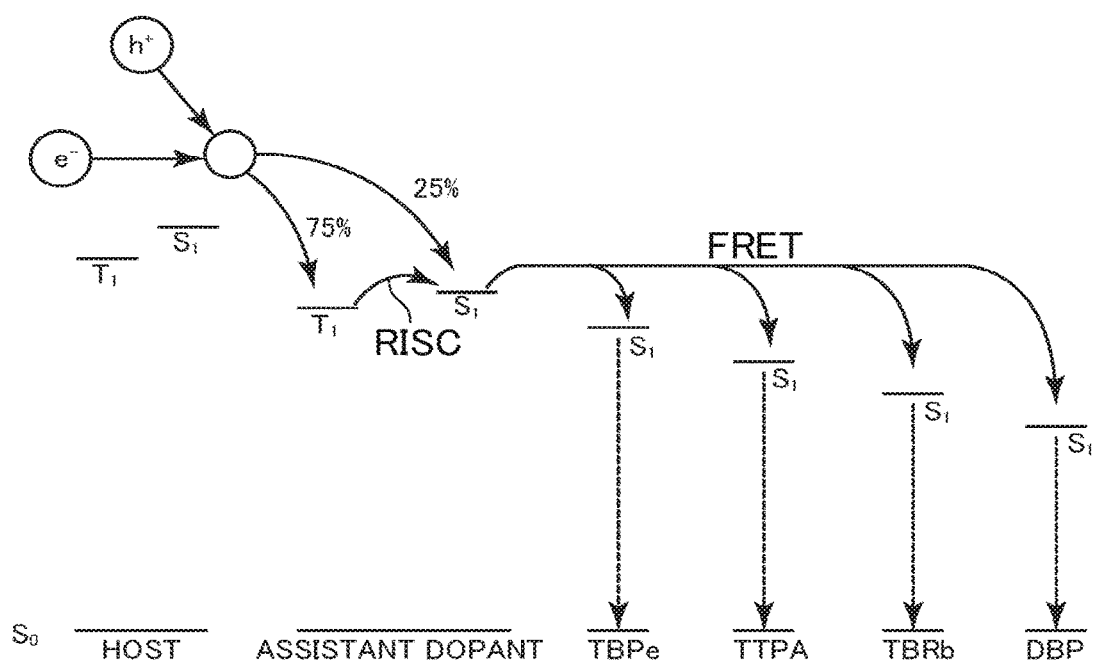
FIG. 10 is a schematic view for explaining a fluorescent emission mechanism in an organic EL device using a TADF material as an assistant dopant.

The host material, the assistant dopant, and the light-emitting dopant used to form the emissive layer 110, that is, the host layer 120, the assistant dopant layer 122, and the light-emitting dopant layer 124, are combined in such a way that their respective energy levels satisfy the relation shown in FIG. 10. That is, the $T_1$ level of the host material, the $S_1$ level of the assistant dopant, and the $S_1$ level of the light-emitting dopant are given in order from the highest energy level.

Inside the emissive layer 110, the assistant dopant layer 122 is in contact with the host layer 120, and the light-emitting dopant layer 124 is in contact with the assistant dopant layer 122. For example, as shown in FIG. 4, the emissive layer 110 can be a multilayer structure in which the assistant dopant layer 122 is stacked on both sides of the light-emitting dopant layer 124 and in which the host layer 120 is stacked on the surface opposite to the surface in contact with the light-emitting dopant layer 124, of each assistant dopant layer 122. The upper electrode 62 and the lower electrode 100 are in contact with these host layers 120.

Figure 5:
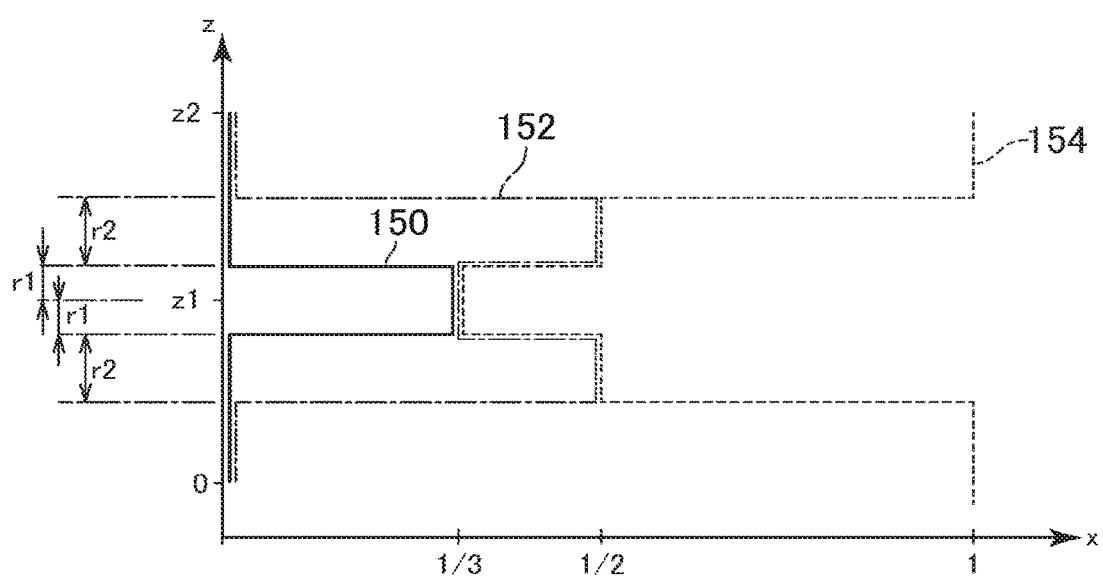
FIG. 5 is a graph showing an example of the composition rate of each component in the emissive layer shown in FIG. 4.

FIG. 5 is a graph showing an example of the composition ratio of the respective components of the emissive layer 110 shown in FIG. 4. A z-axis corresponding to the direction of the film thickness of the emissive layer 110 is set in the vertical direction, and an x-axis corresponding to the material ratio is set in the horizontal direction. The origin of the z-axis is the boundary between the emissive layer 110 and the lower electrode 100. The center position of the light-emitting dopant layer 124 is z1. The boundary position between the emissive layer 110 and the upper electrode 62 is z2. That is, the thickness of the emissive layer 110 is z2. Also, the thickness of the light-emitting dopant layer 124 is expressed as 2×r1, and the thickness of each assistant dopant layer 122 is expressed as r2. In FIG. 5, a solid line 150 indicates the ratio of the light-emitting dopant. A chain-dotted line 152 indicates the ratio of the assistant dopant. A dotted line 154 indicates the ratio of the host material.

In the example shown in FIG. 5, the light-emitting dopant layer 124 is made up of three components, that is, the light-emitting dopant, the assistant dopant, and the host material. For example, the volume ratio of the respective components in the light-emitting dopant layer 124 is even, that is, $x=\frac{1}{3}$ for each component.

In the assistant dopant layer 122, the volume ratio of the respective components can be made even, that is, $x=\frac{1}{2}$ for each of the assistant dopant and the host material. However, in the assistant dopant layer 122, the light-emitting dopant may be present in a very small amount compared with the other two materials.

The host layer 120 is substantially made up of the host material only, of the three components forming the emissive layer 110. However, in the host layer 120, the light-emitting dopant and the assistant dopant may be present in a very small amount compared with the host material.

For example, the thickness z2 of the emissive layer 110 can be 30 nanometers (nm), and r1≤2.5 nm and r2≤10 nm can hold.

Next, the manufacturing method of the emissive layer 110 shown in FIG. 4 will be described. The emissive layer 110 is formed by vapor deposition after stacking the HTL/HIL layer 112 on the lower electrode 100. The vapor deposition process for forming the emissive layer 110 includes a plurality of vapor deposition processes corresponding to the layers with different compositions provided in the emissive layer 110, that is, the host layer 120, the assistant dopant layer 122, and the light-emitting dopant layer 124.

FIGS. 6A to 6E are schematic vertical cross-sectional views of the OLED part in the main process at the time of forming the emissive layer 110 shown in FIG. 4. After the HTL/HIL layer 112 is formed, the host material is deposited to form the first host layer 120 (first host layer forming process, FIG. 6A).

After the first host layer 120 is formed, the assistant dopant and the host material are co-deposited. The ratio of the amounts of deposition of these materials can be ½ each, corresponding to the composition ratio of the assistant dopant layer 122 shown in FIG. 5. The thickness of the film formed in this process is set to such an extent that, for example, the film of the assistant dopant is formed in the shape of an island or a plurality of islands on the surface of the first host layer 120. For example, the average film thickness within the vapor deposition target surface can be several nm. In this process, an assistant dopant film 200a or a host material film (host film) 202a is formed on substantially the entire surface of the first host layer 120, thus substantially forming the first assistant dopant layer 122 (first assistant dopant layer forming process, FIG. 6B).

Next, the light-emitting dopant, the assistant dopant, and the host material are co-deposited. The ratio of the amounts of deposition of these materials can be ⅓ each, corresponding to the composition ratio of the light-emitting dopant layer 124 shown in FIG. 5. The thickness of the film formed in this process can be set to such an extent that the film of the light-emitting dopant and the film of the assistant dopant are formed in the shape of an island or a plurality of islands on the vapor deposition target surface. For example, the average film thickness within the vapor deposition target surface can be several nm. In this process, any of a light-emitting dopant film 204, an assistant dopant film 200b, and a host film 202b is formed on substantially the entire vapor deposition target surface, thus substantially forming the light-emitting dopant layer 124 (light-emitting dopant layer forming process, FIG. 6C). A part of the material deposited in this light-emitting dopant layer forming process fills a recess that can be present on the vapor deposition target surface after the first assistant dopant layer forming process, and thus becomes a part of the first assistant dopant layer 122.

Next, the assistant dopant and the host material are co-deposited again. The ratio of the amounts of deposition of these materials can be ½ each, corresponding to the composition ratio of the assistant dopant layer 122 shown in FIG. 5. The thickness of the film formed in this process can be set to such an extent that the film of the assistant dopant is formed in the shape of an island or a plurality of islands on the vapor deposition target surface. For example, the average film thickness within the vapor deposition target surface can be several nm. In this process, an assistant dopant film 200c or a host film 202c is formed on substantially the entire vapor deposition target surface, thus substantially forming the second assistant dopant layer 122 (second assistant dopant layer forming process, FIG. 6D). Apart of the material deposited in this second assistant dopant layer forming process fills a recess that can be present on the vapor deposition target surface after the light-emitting dopant layer forming process, and thus becomes a part of the light-emitting dopant layer 124.

Figure 6A:
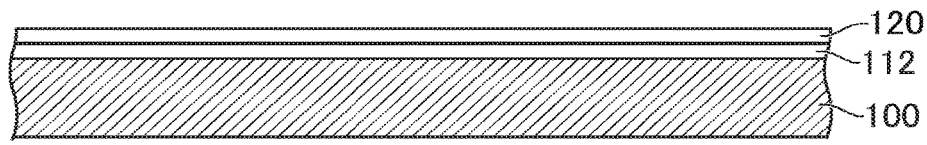
FIGS. 6A to 6E are schematic vertical cross-sectional views of the OLED part in a main process at the time of forming the emissive layer shown in FIG. 4.
Figure 6B:
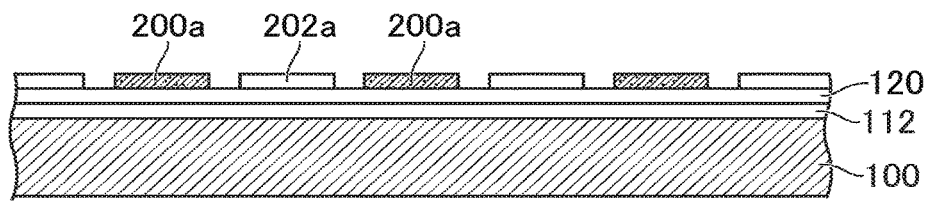
Figure 6C:
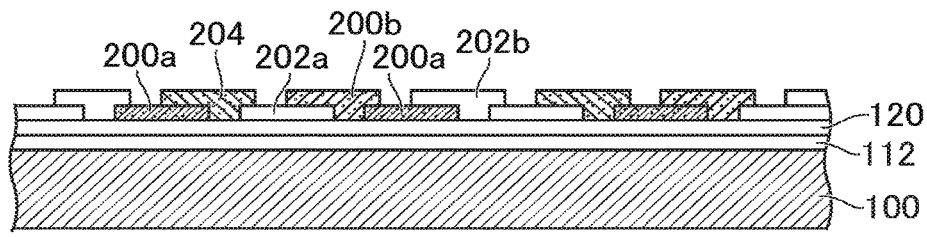
Figure 6D:
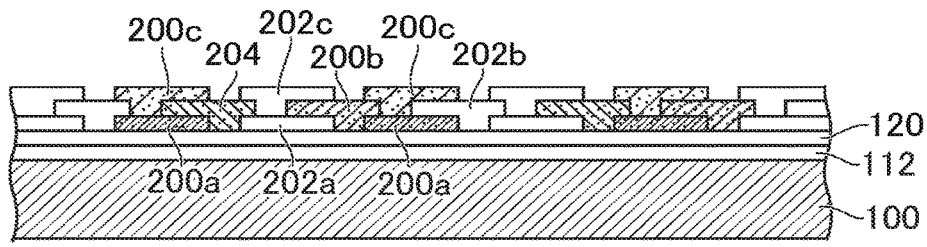
Figure 6E:
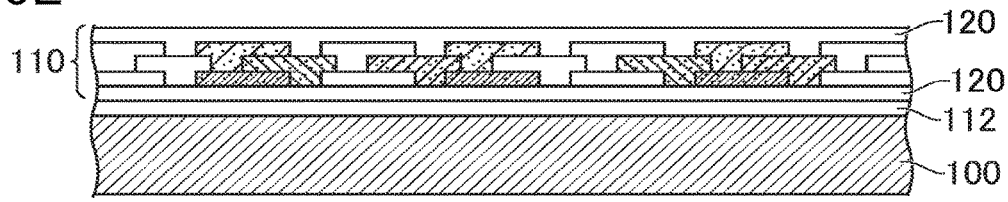

The host material is deposited thereon to form the second host layer 120 (second host layer forming process). Thus, the multilayer structure of the emissive layer 110 is completed (FIG. 6E). A part of the material deposited in the second host layer forming processing fills a recess that can be present on the vapor deposition target surface after the second assistant dopant layer forming process, and thus becomes a part of the light-emitting dopant layer 124.

On the surface of this emissive layer 110, the ETL/EIL layer 114 and the upper electrode 62 are stacked in order, thus providing the OLED shown in FIG. 4.

Figure 7:
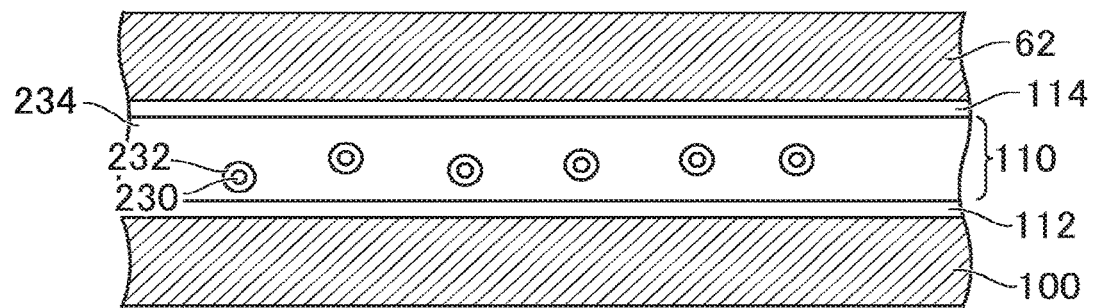
FIG. 7 is a schematic vertical cross-sectional view of the OLED, for explaining the effects of the emissive layer shown in FIG. 6E.

FIG. 7 is a schematic vertical cross-sectional view of the OLED for explaining the effects of the emissive layer 110 shown in FIG. 6E. By mixing a TADF as an assistant dopant into the emissive layer, improved light emission efficiency can be achieved in the TADF mechanism shown in FIG. 10. In order for the TADF mechanism to function effectively, it is necessary that a charge transport path of the host should be formed in such a way as to secure the probability of recombination in the host, of holes injected into the emissive layer from the anode and electrons injected into the emissive layer from the cathode, that the triplet state of excitons generated by the charge recombination should be smoothly transferred to the TADF molecules, and that excitons converted to the singlet state with the TADF molecules should be smoothly transferred to the light-emitting dopant molecules. In this respect, a structure in which particle bodies, each made up of a very small light-emitting dopant 230 surrounded by a thin film of an assistant dopant 232, are scattered inside a host material 234, is preferable, as shown in FIG. 7. For example, it is conceivable that such very small particle bodies are achieved by a micelle-like structure.

However, it is not easy to obtain a material having properties for forming a micelle-like structure, and to prepare the foregoing particle structure directly in that form. The invention is to achieve improvement in light emission efficiency in the TADF mechanism by realizing the foregoing particle structure in a simulative manner. That is, with the structure of the emissive layer 110 according to the embodiment described with reference to FIGS. 6A to 6E, the charge transport path of the host can be secured and the respective materials can be brought closer to each other. Therefore, the upconversion and transfer of excitons are carried out smoothly. In forming the structure of the emissive layer 110, its material requires no special characteristics such as forming a micelle-like structure. Therefore, a high degree of freedom in material selection is achieved and this structure can be formed relatively easily.

In the embodiment, in order to provide a structure similar to the particle bodies shown in FIG. 7, the assistant dopant layer 122 and the host layer 120 are stacked in order, vertically symmetrically as viewed from the light-emitting dopant layer 124 in the example shown in FIG. 4 or FIGS. 6A to 6E. However, improvement in light emission efficiency can also be achieved with other arrangements of the host layer 120, the assistant dopant layer 122, and the light-emitting dopant layer 124 in the multilayer structure of the emissive layer 110, as long as the distance between the host material and the assistant dopant and the distance between the assistant dopant and the light-emitting dopant are shortened. For example, the emissive layer 110 can be a multilayer structure in which the host layer 120, the assistant dopant layer 122, the light-emitting dopant layer 124, and the host layer 120 are stacked in this order or in the reverse order from the side of the lower electrode 100, which is simpler than the structure shown in FIG. 4.

Also, if a multilayer body made up of the assistant dopant layer 122 and the light-emitting dopant layer 124 only, specifically, the multilayer body in which the light-emitting dopant layer 124 is held between the two assistant dopant layers 122, present in the emissive layer 110 shown in FIG. 4, or a simpler multilayer body made up of the assistant dopant layer 122 and the light-emitting dopant layer 124, is called a dopant multilayer body, the emissive layer 110 can be a structure including a plurality of dopant multilayer bodies. This can further improve light emission efficiency. Inside the emissive layer 110, the plurality of dopant multilayer bodies is stacked, holding the host layer 120 between the respective dopant multilayer bodies.

Second Embodiment

An organic EL display device according to a second embodiment of the invention is different from the first embodiment in the structure of the emissive layer of the OLED and the manufacturing method, but is basically the same as the first embodiment in the other features. Therefore, hereinafter, the same components as those in the first embodiment are denoted by the same reference signs, without further explanation, and mainly the differences are described.

FIGS. 1 to 3 are incorporated by reference in this embodiment. FIGS. 8A to 8E are schematic vertical cross-sectional views of the OLED part in the main process at the time of forming an emissive layer 110b in this embodiment. The emissive layer 110b is formed by vapor deposition after the HTL/HIL layer 112 is stacked on the lower electrode 100. The vapor deposition process for forming the emissive layer 110b includes a plurality of vapor deposition processes corresponding to the layers with different compositions provided within the emissive layer 110b.

Figure 8A:
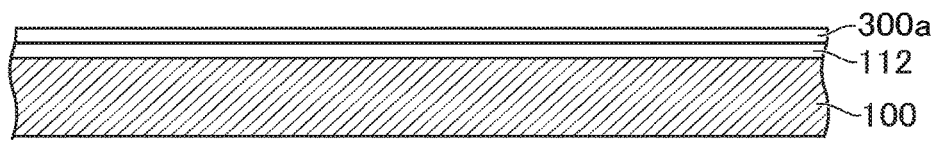
FIGS. 8A to 8E are schematic vertical cross-sectional views of an OLED part in a main process at the time of forming the emissive layer of an OLED according to a second embodiment of the invention.

First, after the HTL/HIL layer 112 is formed, the host material is deposited on the entire surface thereof. A host film 300a is thus formed (FIG. 8A).

Figure 8B:
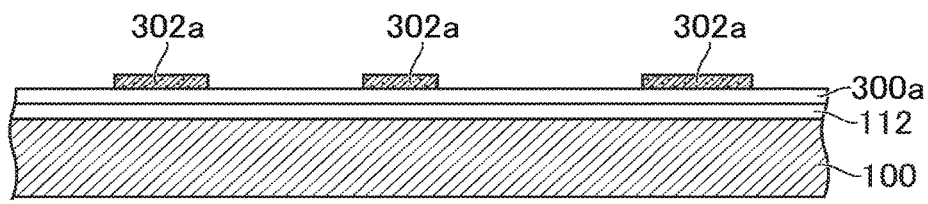

After the host film 300a is formed, the assistant dopant is deposited. The thickness of the film formed in this process is set to such an extent that the film of the assistant dopant is formed in the shape of an island on the vapor deposition target surface. For example, the average film thickness within the vapor deposition target surface can be several nm. In this process, an assistant dopant film 302a is formed in patches on the surface of the host film 300a (FIG. 8B).

Figure 8C:
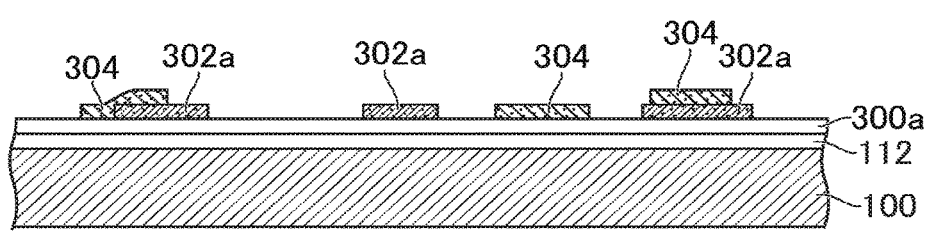

Next, the light-emitting dopant is deposited. The thickness of the film formed in this process can be set to such an extent that the film of the light-emitting dopant is formed in the shape of an island on the vapor deposition target surface. For example, the average film thickness within the vapor deposition target surface can be several nm. In this process, a light-emitting dopant film 304 is formed in patches in the vapor deposition target surface (FIG. 8C). In the light-emitting dopant film 304 deposited in this process, there can be a part stacked on the surface of the assistant dopant film 302a and a part stacked on the surface of the host film 300a.

Figure 8D:
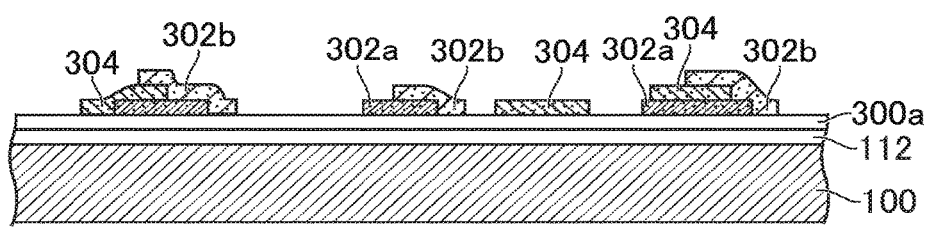

Next, the assistant dopant is deposited again. The thickness of the film formed in this process can be set to such an extent that the film of the assistant dopant is formed in the shape of an island on the vapor deposition target surface. For example, the average film thickness within the vapor deposition target surface can be several nm. In this process, an assistant dopant film 302b is formed in patches in the vapor deposition target surface (FIG. 8D). In the assistant dopant film 302b deposited in this process, there can be a part stacked on the surface of the light-emitting dopant film 304, a part stacked on the surface of the assistant dopant film 302a, and a part stacked on the surface of the host film 300a.

Figure 8E:
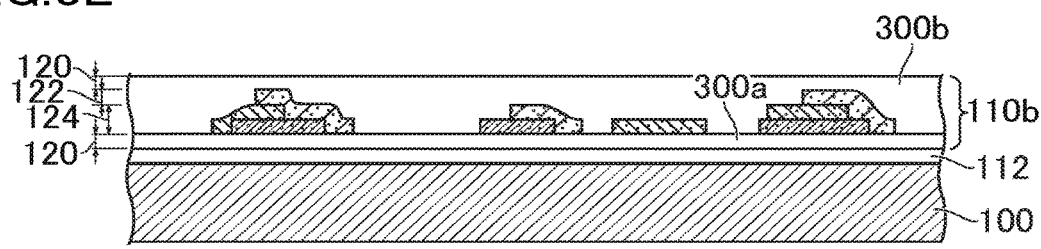

The host material is deposited thereon to form a host film 300b. The multilayer structure of the emissive layer 110b is thus completed (FIG. 8E). In the host film 300b deposited in this process, there can be a part stacked on the surface of the assistant dopant film 302b, a part stacked on the surface of the light-emitting dopant film 304, a part stacked on the surface of the assistant dopant film 302a, and a part stacked on the surface of the host film 300a.

The ETL/EIL layer 114 and the upper electrode 62 are stacked in order on the surface of this emissive layer 110b, thus forming the OLED 6.

Here, the assistant dopant films 302a, 302b and the light-emitting dopant film 304 are formed in such a way as not to completely cover the host film 300a, that is, in such a way that the host film 300a is exposed in a certain area in the state where the assistant dopant film 302b is formed. Thus, the host film 300b stacked thereon and the exposed part of the host film 300a contact each other, thus forming the charge transport path in the host. That is, the probability of recombination in the host, of holes injected into the emissive layer 110b from the anode and electrons injected into the emissive layer 110b from the cathode, is secured.

Also, the assistant dopant films 302a, 302b and the light-emitting dopant film 304 are formed in such a way that the overlapping part of the assistant dopant films 302a, 302b and the light-emitting dopant film 304 has a large area, while leaving a gap to form the charge transport path in the host. At this overlapping part of the assistant dopant films 302a, 302b and the light-emitting dopant film 304 formed in the host, the TADF mechanism functions, thus improving light emission efficiency.

Incidentally, if the emissive layer 110b shown in FIG. 8E is applied to the multilayer structure made up of the host layer 120, the assistant dopant layer 122, and the light-emitting dopant layer 124 described in the first embodiment, the emissive layer 110b can be seen as a structure in which the host layer 120, the light-emitting dopant layer 124, the assistant dopant layer 122, and the host layer 120 are stacked in order from the side of the lower electrode 100, as shown in FIG. 8E.

In the structure shown in FIG. 8E, a three-layer structure part in which the assistant dopant films 302a, 302b are stacked on both sides of the light-emitting dopant film 304 is formed. This part can be seen as a structure similar to the particle bodies made up of the light-emitting dopant 230 and the assistant dopant 232 shown in FIG. 7.

Figure 9:
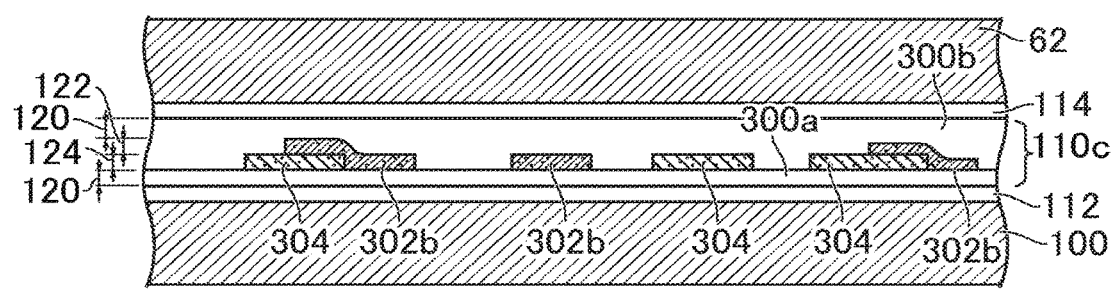
FIG. 9 is schematic vertical cross-sectional view of an OLED having an emissive layer including a two-layer structure made up of an assistant dopant film and a light-emitting dopant film.

Meanwhile, the TADF mechanism functions even with a two-layer structure made up of the light-emitting dopant and the assistant dopant placed in the host. Therefore, for example, in the manufacturing method shown in FIGS. 8A to 8E, the process of forming the assistant dopant film 302a may be omitted, and the light-emitting dopant film 304, the assistant dopant film 302b, and the host film 300b may be stacked in order on the host film 300a, thus forming an OLED having a two-layer structure made up of the light-emitting dopant and the assistant dopant. FIG. 9 is a schematic vertical cross-sectional view of an OLED having an emissive layer 110c including this two-layer structure.

Incidentally, if the emissive layer 110c shown in FIG. 9 is applied to the multilayer structure of the host layer 120, the assistant dopant layer 122, and the light-emitting dopant layer 124 described in the first embodiment, the emissive layer 110c can be seen as a structure in which the host layer 120, the light-emitting dopant layer 124, the assistant dopant layer 122, and the host layer 120 are stacked in order from the side of the lower electrode 100.

A person skilled in the art can readily think of various changes and modifications within the scope of the technical idea of the invention, and such changes and modifications should be understood as falling within the scope of the invention. For example, the addition or deletion of a component, or a design change suitably made to the foregoing embodiments by a person skilled in the art, or the addition or omission of a process, or a condition change in the embodiments is included in the scope of the invention as long as such change or the like includes the spirit of the invention.

Also, as a matter of course, other advantageous effects that may be achieved by the configurations described in the embodiment should be understood as being achieved by the invention if those effects are clear from the specification or can be readily thought of by a person skilled in the art.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL device comprising at least an emissive layer between a pair of electrodes made up of an anode and a cathode,
the emissive layer comprising:
   a host layer including a host material;
   an assistant dopant layer which is a layer adjacent to the host layer and where an island shaped film of an assistant dopant and the host material are intermingled within a plane, the assistant dopant made of a thermally activated delayed fluorescence material; and
   a light-emitting dopant layer which is a layer adjacent to the assistant dopant layer and where a light-emitting dopant and the host material are intermingled within a plane, the light-emitting dopant made of a fluorescent material emitting light by being excited by the assistant dopant,
wherein the host material has a highest content ratio in the host layer, of the layers forming the emissive layer,
wherein the island shaped film of the assistant dopant is in contact with the light-emitting dopant,
wherein the island shaped film of the assistant dopant surrounds the light-emitting dopant without a space between the island shaped film of the assistant dopant and the light-emitting dopant, and
wherein the host material surrounds the island shaped film of the assistant dopant without a space between the host material and the island shaped film of the assistant dopant.

2. The organic EL device according to claim 1, wherein the assistant dopant is further intermingled within the plane of the light-emitting dopant layer.

3. The organic EL device according to claim 2, wherein the assistant dopant has a highest content ratio in the assistant dopant layer, of the layers forming the emissive layer.

4. The organic EL device according to claim 1, wherein the light-emitting dopant layer has a thickness of 5 nanometers or less, and the assistant dopant layer has a thickness of 10 nanometers or less.

\* \* \* \* \*